(12) United States Patent
Yang et al.

(10) Patent No.: US 10,797,004 B2
(45) Date of Patent: *Oct. 6, 2020

(54) SEMICONDUCTOR DEVICE PACKAGE

(71) Applicant: Advanced Semiconductor Engineering, Inc., Kaohsiung (TW)

(72) Inventors: Shao-Lun Yang, Kaohsiung (TW); Yu-Shun Hsieh, Kaohsiung (TW); Chia Yi Cheng, Kaohsiung (TW); Hong Jie Chen, Kaohsiung (TW); Shih Yu Huang, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/421,238

(22) Filed: May 23, 2019

(65) Prior Publication Data
US 2019/0279941 A1 Sep. 12, 2019

Related U.S. Application Data

(63) Continuation of application No. 15/789,858, filed on Oct. 20, 2017, now Pat. No. 10,312,198.

(51) Int. Cl.
*H01L 23/552* (2006.01)
*H01L 23/495* (2006.01)

(52) U.S. Cl.
CPC ........ *H01L 23/552* (2013.01); *H01L 23/4952* (2013.01); *H01L 23/49548* (2013.01); *H01L 23/49558* (2013.01); *H01L 23/49541* (2013.01); *H01L 23/49582* (2013.01); *H01L 2924/1815* (2013.01); *H01L 2924/19107* (2013.01); *H01L 2924/3025* (2013.01); *H01L 2924/3511* (2013.01)

(58) Field of Classification Search
CPC .................................................. H01L 23/49558
See application file for complete search history.

(56) References Cited

U.S. PATENT DOCUMENTS

| 6,097,098 | A | 8/2000 | Ball |
| 8,372,741 | B1 | 2/2013 | Co et al. |
| 8,390,103 | B2 | 3/2013 | Zhao |
| 9,190,387 | B2 | 11/2015 | Yao et al. |
| 10,312,198 | B2 * | 6/2019 | Yang ..................... H01L 23/552 |

(Continued)

OTHER PUBLICATIONS

Non-Final Office Action for U.S. Appl. No. 15/789,858, dated Jul. 2, 2018, 7 pages.

(Continued)

*Primary Examiner* — Thao P Le
(74) *Attorney, Agent, or Firm* — Foley & Lardner LLP

(57) ABSTRACT

A semiconductor device package includes: (1) a lead frame including a connection element and multiple leads; (2) a package body encapsulating the lead frame, wherein the package body includes a lower surface and an upper surface opposite to the lower surface, the package body includes a cavity exposing at least one of the leads; (3) at least one conductive via disposed in the cavity of the package body, electrically connected to the connection element, and exposed from the upper surface of the package body; and (4) a conductive layer disposed on the upper surface of the package body and the conductive via.

20 Claims, 13 Drawing Sheets

(56) References Cited

U.S. PATENT DOCUMENTS

| | | | |
|---|---|---|---|
| 2004/0104457 A1* | 6/2004 | Tan | H01L 23/3107 |
| | | | 257/666 |
| 2008/0211069 A1* | 9/2008 | Amano | H01L 23/3107 |
| | | | 257/666 |
| 2009/0243086 A1 | 10/2009 | Warren | |
| 2009/0256266 A1 | 10/2009 | Lao et al. | |
| 2015/0243589 A1* | 8/2015 | Ho | H01L 27/088 |
| | | | 257/329 |
| 2019/0304924 A1* | 10/2019 | Niu | H01L 23/49524 |

OTHER PUBLICATIONS

Notice of Allowance for U.S. Appl. No. 15/789,858, dated Jan. 24, 2019, 7 pages.

* cited by examiner

SEMICONDUCTOR DEVICE PACKAGE

CROSS-REFERENCE TO RELATED APPLICATIONS

This application is a continuation of U.S. patent application Ser. No. 15/789,858, filed Oct. 20, 2017, the contents of which are incorporated herein by reference in their entirety.

BACKGROUND

1. Technical Field

The present disclosure relates to a semiconductor device package and a method for manufacturing the same, and to a semiconductor device package including an electromagnetic interference (EMI) shield.

2. Description of the Related Art

A semiconductor device package may include a substrate, a lead frame or other carriers. The substrate may include multiple conductive layers for signal transmission (e.g. signal layer(s), ground layer(s), etc.). The ground layer(s) and the signal layer(s) may be stacked (e.g. vertically stacked). An EMI shield may be formed on the substrate and electrically connected to the ground layer.

At least some of the EMI shielding techniques can be applied to a lead frame base and to quad-flat no-leads (QFN) and quad-flat packages (QFP). The ground lead(s) and signal lead(s) of the lead frame may be at a same elevation, and the lead frame may implement certain corresponding features to avoid short-circuits between the ground lead(s) and signal lead(s) when forming the EMI shield, or at a later time. However, such lead frame structures can be complex and expensive. Yield rates and rigidity of such a lead frame can be reduced. Warpage and overflow of an encapsulant may occur when forming the encapsulant for such a lead frame, or at a later time. A trench may be formed in the encapsulant for the formation of the EMI shield, and it may be challenging to control a size of the trench. Moreover, an aspect ratio (AR ratio) of the trench (width relative to depth) may be relatively large to facilitate the formation of the EMI shield by a sputtering technique, which may adversely affect yield of the semiconductor device package.

SUMMARY

In one or more embodiments, a semiconductor device package includes: (1) a lead frame including a connection element and multiple leads; (2) a package body encapsulating the lead frame, wherein the package body includes a lower surface and an upper surface opposite to the lower surface, the package body includes a cavity exposing at least one of the leads; (3) at least one conductive via disposed in the cavity of the package body, electrically connected to the connection element, and exposed from the upper surface of the package body; and (4) a conductive layer disposed on the upper surface of the package body and the conductive via.

In one or more embodiments, a semiconductor device package includes: (1) a lead frame including a tie bar and multiple leads; (2) a package body encapsulating the lead frame, the package body having an upper surface and a lower surface opposite to the upper surface, wherein the lower surface exposes the tie bar; (3) a grounding element extending from the upper surface of the package body to a first portion of the tie bar, wherein the grounding element includes a conductive via and a wire element, and wherein the conductive via electrically connects to the tie bar by the wire element; and (4) a conductive layer disposed on the upper surface of the package body and electrically connected to the grounding element.

BRIEF DESCRIPTION OF THE DRAWINGS

Common reference numerals are used throughout the drawings and the detailed description to indicate the same or similar elements. Embodiments of the present disclosure will be readily understood from the following detailed description taken in conjunction with the accompanying drawings.

DETAILED DESCRIPTION

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated from by such arrangement.

Figure 1A:
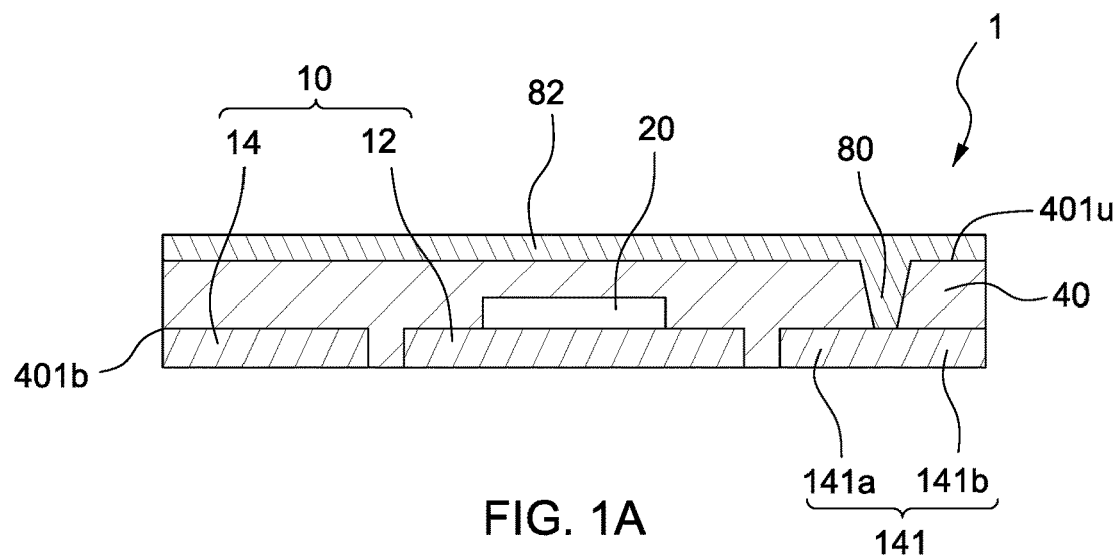
FIG. 1A is a cross-sectional view of a semiconductor device package in accordance with some embodiments of the present disclosure.

FIG. 1A is a cross-sectional view of a semiconductor device package 1 in accordance with some embodiments of the present disclosure. The semiconductor device package 1 includes a lead frame 10, an electronic component 20, a package body 40, at least one conductive via 80 and a conductive layer 82.

Figure 1B:
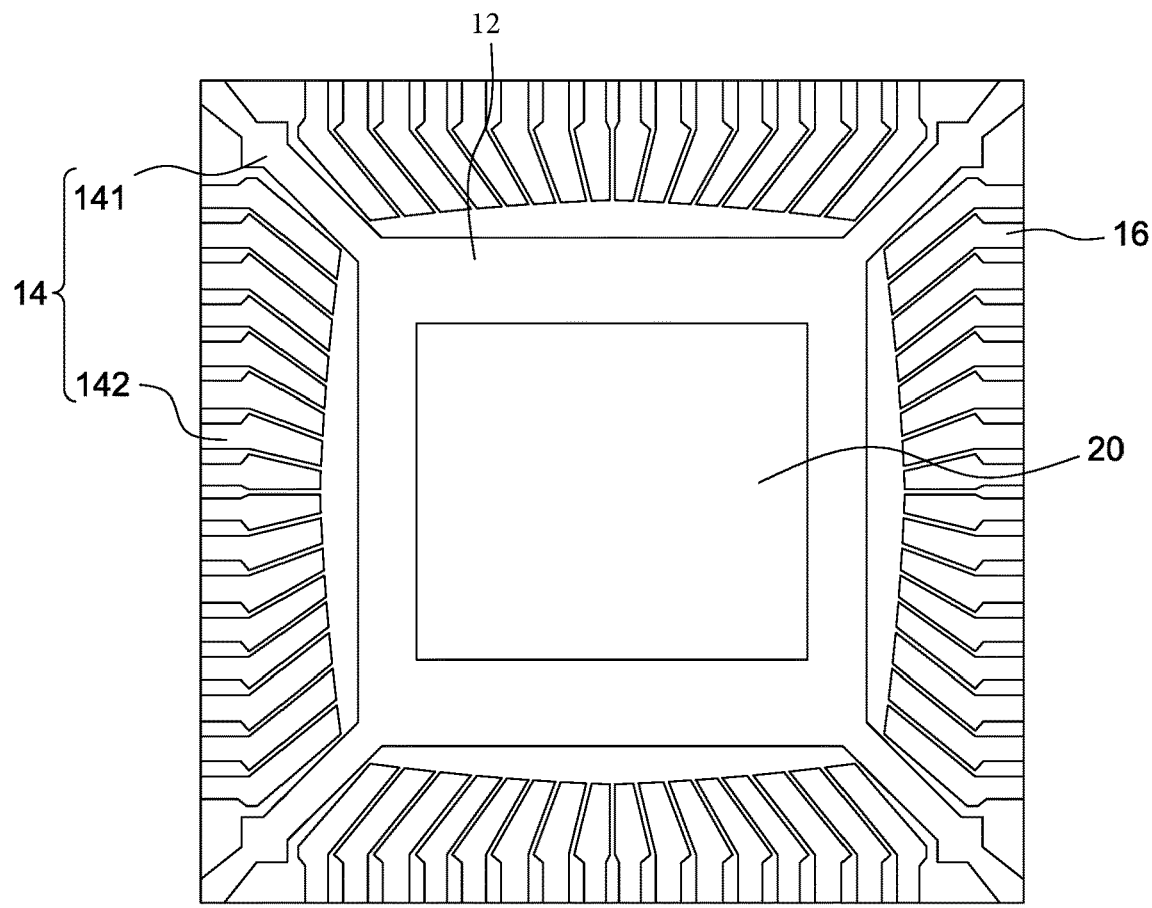
FIG. 1B is a top view of a lead frame as shown in FIG. 1A in accordance with some embodiments of the present disclosure.

FIG. 1B is a top view of the lead frame 10 shown in FIG. 1A in accordance with some embodiments of the present disclosure. The lead frame 10 includes a paddle 12, a plurality of connection elements 14 and a plurality of leads 16. One or more of (e.g. each of) the connection elements 14 may be disposed, for example, adjacent or close to a corner of the lead frame 10. In other embodiments, the connection elements 14 may be disposed in some portions other than the corners of the lead frame 10 (e.g. at an edge of the lead frame 10). In one or more embodiments, a material of the lead frame 10 may include, for example, copper, another metal or metal alloy, or other suitable conductive materials. The connection elements 14 include at least one tie bar 141 and at least one grounded lead 142. At least one of the connection elements 14 may serve as a ground point.

Referring again to FIG. 1A, the tie bar 141 includes a first portion 141a adjacent to and connected to the paddle 12 and a second portion 141b. The first portion 141a is disposed between the paddle 12 and the second portion 141b. The electronic component 20 is disposed on the paddle 12. In one or more embodiments, the electronic component 20 may include a semiconductor die. The package body 40 encapsulates the electronic component 20 and the lead frame 10. In one or more embodiments, a material of the package body 40 may include, for example, a molding compound or other suitable materials. The package body 40 has an upper surface 401u and a lower surface 401b opposite to the upper surface 401u.

The at least one conductive via 80 extends from the upper surface 401u of the package body 40 to the lower surface 401b of the package body 40 and is in contact with the connection element 14 for grounding. The conductive via 80 may serve as a grounding element. In one or more embodiments, the conductive via 80 for grounding extends from the upper surface 401u of the package body 40 to the first portion 141a of the tie bar 141. The conductive via 80 formed in the package body 40 can be implemented instead of, or in addition to, half-etching (partial etching) to a top surface of the leads 16, and to avoid a complicated design and lower yield for the lead frame 10. In one or more embodiments, the number of the conductive via 80 electrically connected to the connection element 14 may be one, two, three or more. Each of the conductive vias 80 may extend from the upper surface 401u of the package body 40 to the lower surface 401b of the package body 40. Each of the conductive vias 80 is in contact with at least one connection element 14.

The conductive via 80 is, for example, printed and disposed in the package body 40, electrically connected to the connection element 14, and exposed from the package body 40. A cavity for accommodating the conductive via 80 is formed in the package body 40 by a laser drilling operation and the conductive via 80 is formed by a printing operation, for example, and an available area of the lead frame 10 can be increased since a process for forming one or more trenches in the package body 40 can be avoided.

The conductive layer 82 is, for example, printed and disposed on the package body 40 and the conductive via 80.

The conductive layer 82 is disposed on the upper surface 401u of the package body 40 and electrically connected to the conductive via 80 for grounding. The conductive layer 82 may serve as a shielding layer. In one or more embodiments, a material of the conductive via 80 and/or the conductive layer 82 may include, for example, a conductive paste, a conductive gel or other suitable conductive material.

In one or more embodiments, the semiconductor device package 1 may be a QFN structure. The conductive via 80 formed in the package body 40 can reduce warpage of the lead frame 10, since a recess in a top surface of lead frame 10 may be omitted (e.g. a recess to separate the shielding layer and signal layers). Furthermore, omitting a recess in the top surface of the lead frame 10 can help to prevent molding material from flowing to a bottom of the lead frame 10 (which can affect conductive properties of the leads 16) during a molding process.

Figure 2:
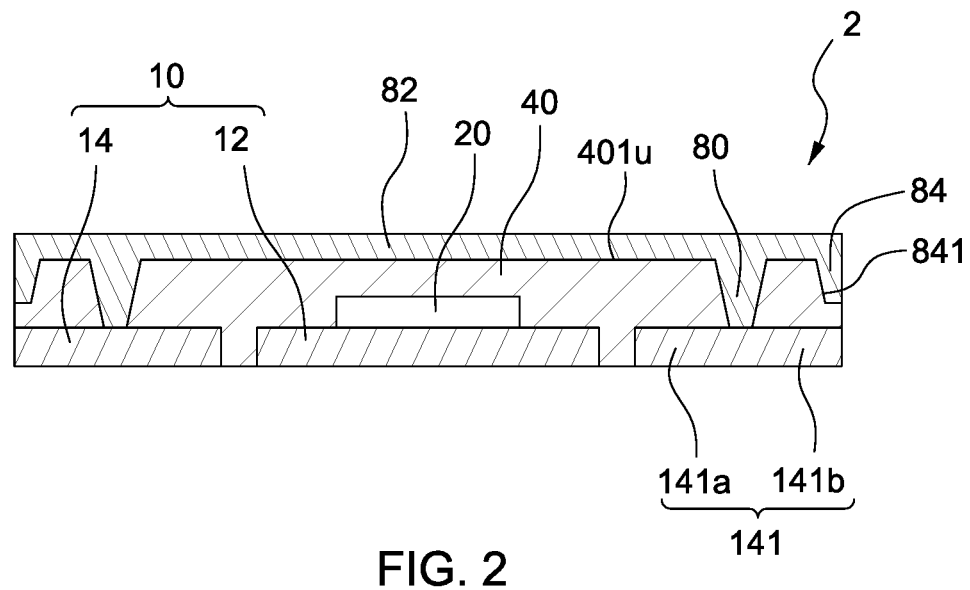
FIG. 2 is a cross-sectional view of a semiconductor device package in accordance with some embodiments of the present disclosure.

FIG. 2 is a cross-sectional view of a semiconductor device package 2 in accordance with some embodiments of the present disclosure. The semiconductor device package 2 shown in FIG. 2 is similar to the semiconductor device package 1 shown in FIG. 1A, and redundant description of same-numbered components may be omitted from the following description. The semiconductor device package 2 includes a lead frame 10, an electronic component 20, a package body 40, at least one conductive via 80, a conductive layer 82 and a conductive wall 84.

The lead frame 10 includes a paddle 12, a connection element 14 and a plurality of leads 16 (e.g. a plurality of leads 16 as shown in FIG. 1B). The conductive wall 84 extends from the conductive layer 82 and extends from the upper surface 401u in to the package body 40. The connection element 14 includes at least one tie bar 141 and at least one grounded lead 142. The connection element 14 may serve as a ground point.

The conductive wall 84 surrounds the electronic component 20 and electrically connects to the at least one conductive via 80 through the conductive layer 82. The conductive wall 84 may serve as a shielding element. The conductive wall 84 also surrounds, at least in part, the periphery of the semiconductor device package 2. The conductive via 80 is disposed between the conductive wall 84 and the electronic component 20. In one or more embodiments, a material of conductive wall 84 may include, for example, a conductive paste, a conductive gel or other suitable conductive material. The conductive via 80 covers (e.g. completely covers) a portion of the connection element 14 along at least one direction (e.g. along an entire width of the portion of the connection element 14). In one or more embodiments, a width of the conductive via 80 is smaller, equal to, or greater than a width of the tie bar 141. In one or more embodiments, a width of the conductive via 80 is smaller, equal to, or greater than a width of the grounded lead 142. The package body 40 is disposed between and separates the conductive wall 84 and the leads 16. In one or more embodiments, the conductive wall 84 is separated from and does not contact the connection element 14.

Figure 3:
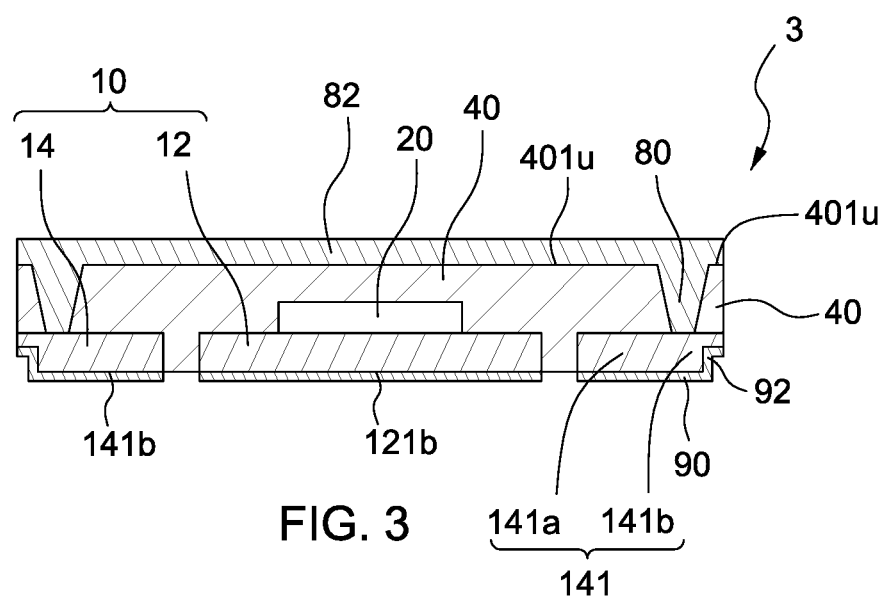
FIG. 3 is a cross-sectional view of a semiconductor device package in accordance with some embodiments of the present disclosure.

FIG. 3 is a cross-sectional view of a semiconductor device package 3 in accordance with some embodiments of the present disclosure. The semiconductor device package 3 shown in FIG. 3 is similar to the semiconductor device package 1 of FIG. 1A, and redundant description of same-numbered components may be omitted from the following description. The semiconductor device package 3 includes a lead frame 10, an electronic component 20, a package body 40, at least one conductive via 80, a conductive layer 82 and a conductive layer 90.

A portion of the connection element 14 is removed to form a first step structure 92 defined by the connection element 14 and adjacent to a lateral surface of the package body 40. In one or more embodiments, a portion of one or more leads 16 (e.g. a plurality of leads 16 as shown in FIG. 1B) is removed to form a second step structure 92 defined by the one or more leads 16 and adjacent to a lateral surface of the package body 40. The step structure 92 is defined by a lower surface of the connection element 14. In one or more embodiments, the step structure 92 is disposed on a lower surface of the leads 16. The conductive layer 90 covers the step structure 92 and a bottom surface 121*b* of a paddle 12 of the lead frame 10 and a bottom surface 141*b* of the connection element 14. The step structure 92 may serve as a wettable element. In one or more embodiments, a material of the conductive layer 90 covering the step structure 92 may include, for example, tin (Sn), another metal, a metal alloy or another suitable conductive material.

Figure 4:
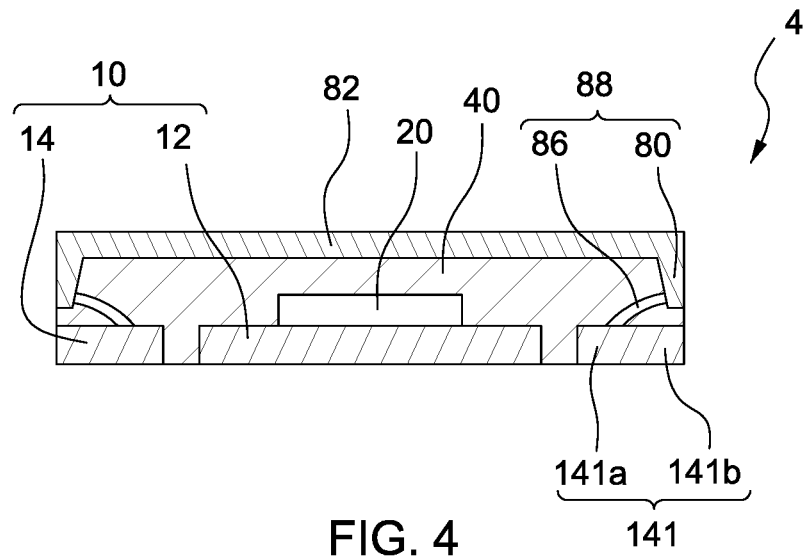
FIG. 4 is a cross-sectional view of a semiconductor device package in accordance with some embodiments of the present disclosure.

FIG. 4 is a cross-sectional view of a semiconductor device package 4 in accordance with some embodiments of the present disclosure. The semiconductor device package 4 shown in FIG. 4 is similar to the semiconductor device package 1 shown in FIG. 1A, and redundant description of same-numbered components may be omitted from the following description. The semiconductor device package 4 includes a lead frame 10, an electronic component 20, a package body 40, a conductive layer 82 and a grounding element 88.

The grounding element 88 is disposed in the package body 40 and has a curved sidewall. The grounding element 88 is electrically connected to the connection element 14. The conductive layer 82 is disposed on the package body 40 and electrically connected to the grounding element 88. In some embodiments, the grounding element 88 includes a conductive via 80 and a wire element 86 (e.g. an arcuate wire element). A portion of the conductive via 80 is exposed from the upper surface 401*u* of the package body 40. The conductive via 80 is electrically connected to a tie bar 141 by the arcuate wire element 86. In some embodiments, the conductive via 80 is electrically connected to a grounded lead 142 (such as the grounded lead 142 shown in FIG. 1B) by the wire element 86. In some embodiments, the wire element 86 may be implemented with a wire bond. In some embodiments, the conductive via 80 is separated from and does not contact the connection element 14.

Figure 5:
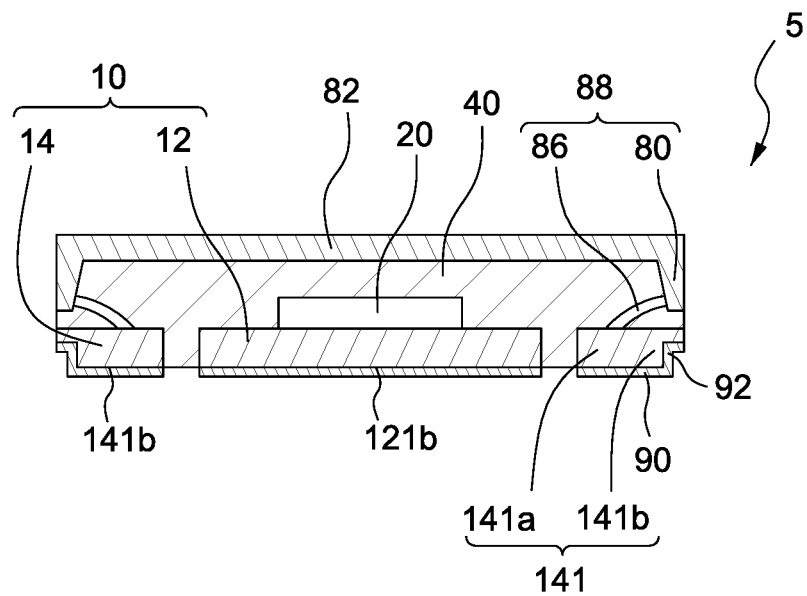
FIG. 5 is a cross-sectional view of a semiconductor device package in accordance with some embodiments of the present disclosure.

FIG. 5 is a cross-sectional view of a semiconductor device package 5 in accordance with some embodiments of the present disclosure. The semiconductor device package 5 shown in FIG. 5 is similar to the semiconductor device package 1 shown in FIG. 1A, and redundant description of same-numbered components may be omitted from the following description. The semiconductor device package 5 includes a lead frame 10, an electronic component 20, a package body 40, a conductive layer 82, a grounding element 88 and a conductive layer 90.

A portion of the connection element 14 is removed to form a step structure 92 defined by the connection element 14 and adjacent to a lateral surface of the package body 40. The step structure 92 is defined by a lower surface of the connection element 14. A conductive layer 90 covers the step structure 92 and a surface 121*b* of a paddle 12 of the lead frame 10, and a surface 141*b* of the connection element 14. The conductive layer 90 may serve as a wettable element. In one or more embodiments, a material of the conductive layer 90 may include, for example, Sn, another metal, or a metal alloy or other suitable conductive material.

The grounding element 88 is disposed in the package body 40 and has a sidewall (e.g. a curved sidewall). The grounding element 88 is electrically connected to the connection element 14. In some embodiments, the grounding element 88 includes a conductive via 80 and a wire element 86 (e.g. an arcuate wire element). The conductive via 80 is electrically connected to the connection element 14 by the wire element 86. In some embodiments, the wire element 86 may be implemented with a wire bond.

Figure 6A:
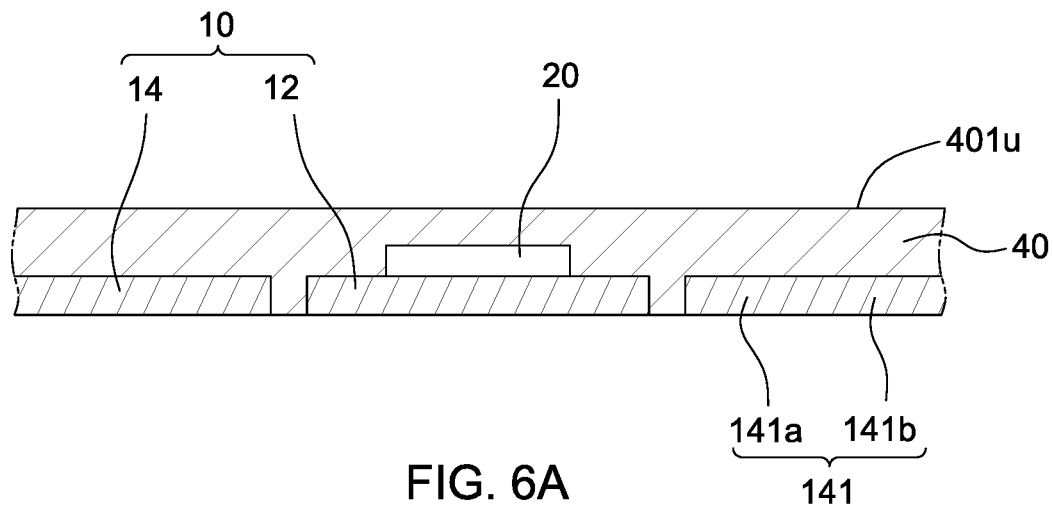
FIG. 6A, FIG. 6B, FIG. 6C, and FIG. 6D illustrate a method for manufacturing a semiconductor device package as shown in FIG. 1A in accordance with some embodiments.

FIG. 6A through FIG. 6D illustrate a method for manufacturing a semiconductor device package 1 as shown in FIG. 1A in accordance with some embodiments. Referring to FIG. 6A, a lead frame 10 is provided. The lead frame 10 includes a paddle 12, a connection element 14 and a plurality of leads 16 (e.g. a plurality of leads 16 as shown in FIG. 1B). In one or more embodiments, the material of the lead frame 10 may be, for example, copper or other suitable conductive materials. The connection element 14 includes at least one tie bar 141 and at least one grounded lead 142 (e.g. a grounded lead 142 as shown in FIG. 1B). The tie bar 141 includes a first portion 141*a* adjacent to and connected to the paddle 12 (e.g. connected as shown in FIG. 1B) and a second portion 141*b*. The first portion 141*a* is disposed between the paddle 12 and the second portion 141*b*.

The electronic component 20 is disposed on a top surface of the paddle 12. In one or more embodiments, the electronic component 20 may include a semiconductor die. The package body 40 encapsulates the electronic component 20 and the lead frame 10. In one or more embodiments, the material of the package body 40 may include, for example, a molding compound or other suitable materials. The package body 40 has an upper surface 401*u* and a lower surface 401*b* opposite to the upper surface 401*u*.

Figure 6B:
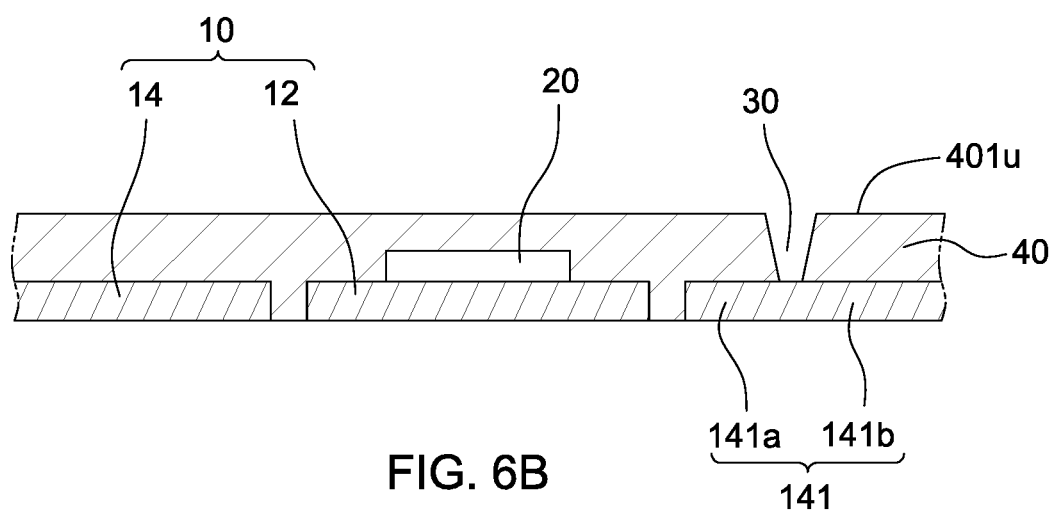

Referring to FIG. 6B, at least one cavity 30 is formed in the package body 40 by removing a portion of the package body 40 from the upper surface 401*u*. The cavity 30 is a recess from the upper surface 401*u* and exposes a portion of a top surface of the connection element 14. The cavity 30, which can be used to accommodate a conductive via 80, is formed by a laser drilling operation and the conductive via 80 is formed by a printing operation. Thus an available area of the lead frame 10 (e.g. available for electrical connection) can be increased, since formation of a trench in the package body 40 can be omitted.

Figure 6C:
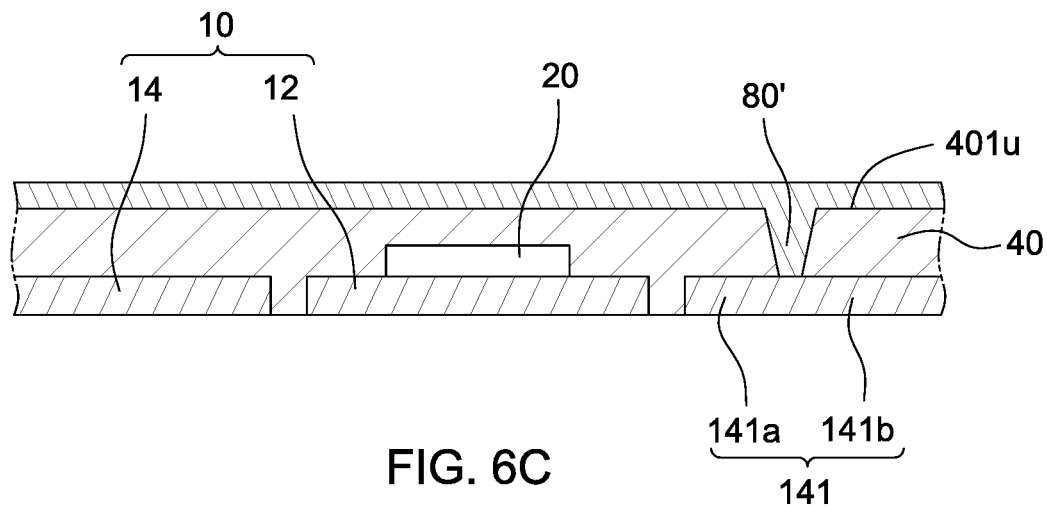
Figure 6D:
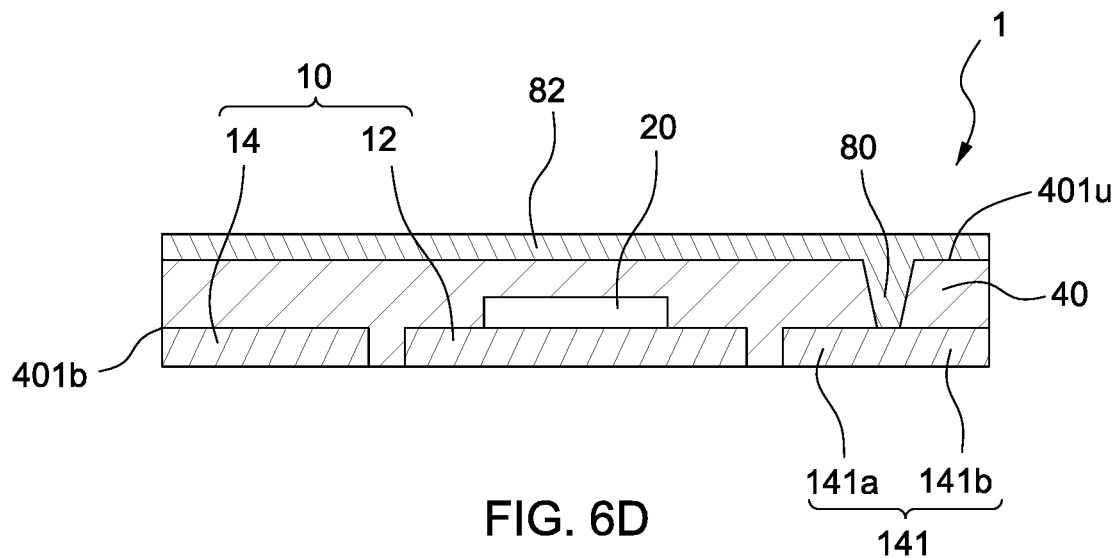

Referring to FIG. 6C, a conductive paste 80' is printed onto the upper surface 401*u* of the package body 40 and in to the at least one cavity 30. The conductive paste 80' is electrically connected to the connection element 14. The conductive via 80 and the conductive layer 82 are formed by the printing operation. The conductive via 80 and the conductive layer 82 may be integrally formed as a monolithic structure. In some embodiments, the conductive layer 82 may be formed by one of printing, spraying or sputtering operations. The conductive via 80 extends from the upper surface 401*u* of the package body 40 to the first portion 141*a* of the tie bar 141. Referring to FIG. 6D, after a singulation operation is performed, the semiconductor device package 1 shown in FIG. 1 is obtained.

Figure 7A:
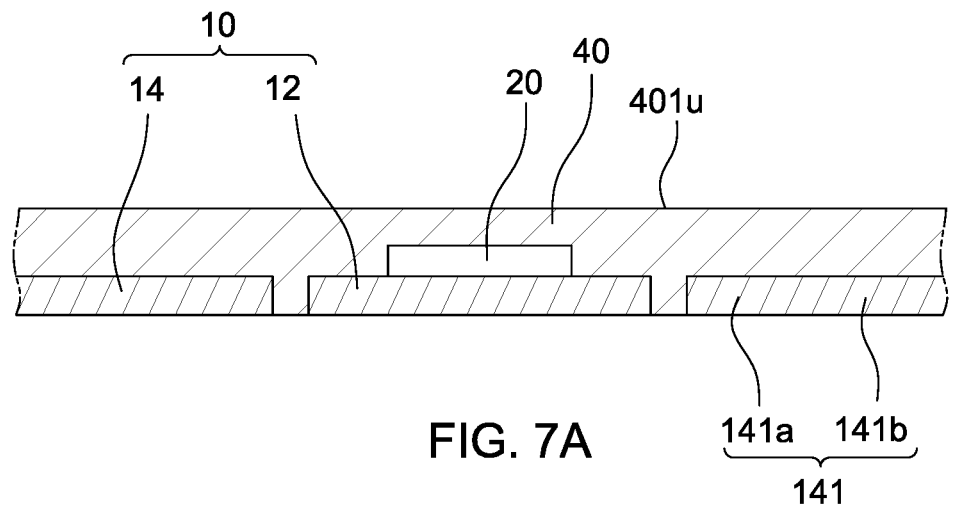
FIG. 7A, FIG. 7B, FIG. 7C, FIG. 7D, and FIG. 7E illustrate a method for manufacturing a semiconductor device package as shown in FIG. 2 in accordance with some embodiments.

FIG. 7A through FIG. 7E illustrate a method for manufacturing a semiconductor device package 2 as shown in FIG. 2 in accordance with some embodiments. Referring to FIG. 7A, a lead frame 10 is provided. The lead frame 10 includes a paddle 12, a connection element 14 and a plurality of leads 16 (e.g. a plurality of leads 16 as shown in FIG. 1B). In one or more embodiments, a material of the lead frame 10 may include, for example, copper, another metal, or other suitable conductive materials. The connection element 14 includes at least one tie bar 141 and at least one grounded lead 142 (e.g. a grounded lead 142 as shown in FIG. 1B). The tie bar 141 includes a first portion 141a adjacent to and connected to the paddle 12 (e.g. connected as shown in FIG. 1B) and a second portion 141b. The first portion 141a is disposed between the paddle 12 and the second portion 141b.

The electronic component 20 is disposed on a top surface of the paddle 12. In one or more embodiments, the electronic component 20 may include a semiconductor die. The package body 40 encapsulates the electronic component 20 and the lead frame 10. In one or more embodiments, a material of the package body 40 may include, for example, a molding compound or other suitable materials. The package body 40 has an upper surface 401u and a lower surface 401b opposite to the upper surface 401u.

Figure 7B:
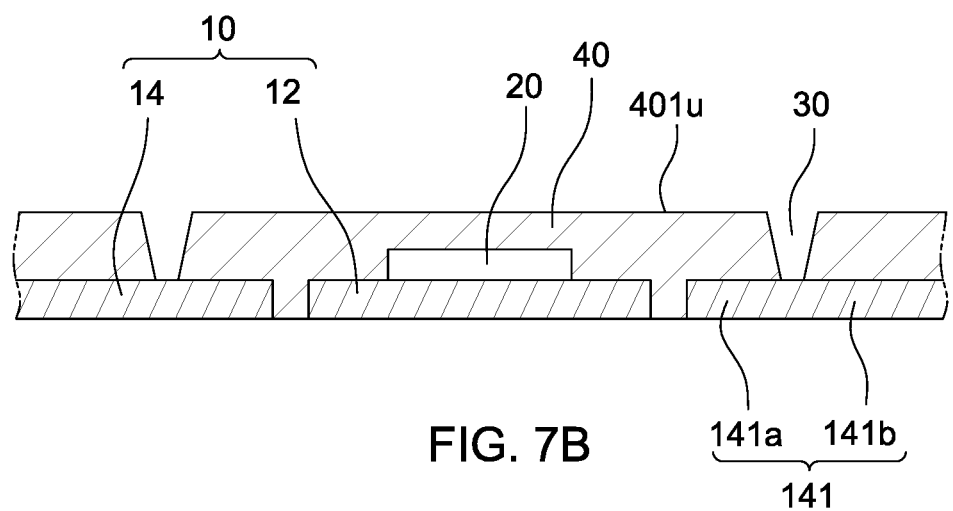

Referring to FIG. 7B, at least one cavity 30 is formed in the package body 40 by removing a portion of the package body 40 from the upper surface 401u. The cavity 30 is a recess from the upper surface 401u and exposes a portion of a top surface of the connection element 14.

Figure 7C:
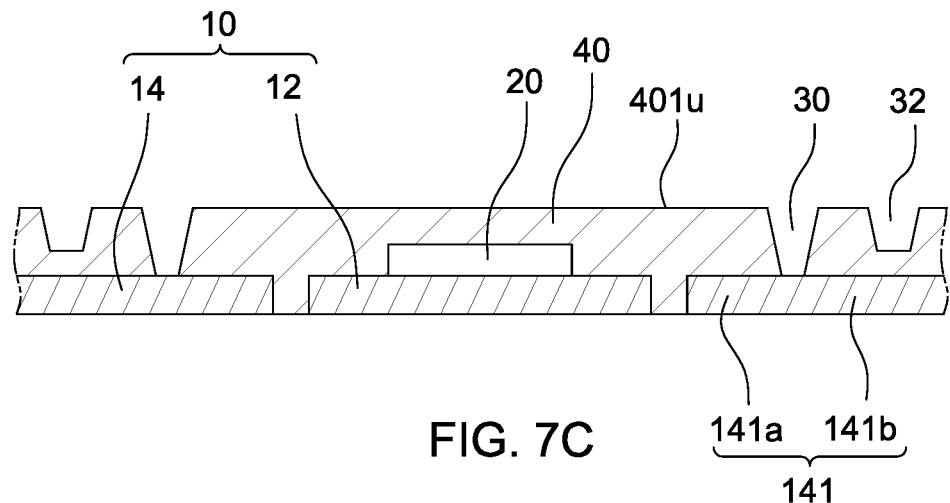

Referring to FIG. 7C, a trench 32 is formed in the package body 40 by removing a portion of the package body 40 from the upper surface 401u. The trench 32 is a recess from the upper surface 401u and does not expose the connection element 14.

Figure 7D:
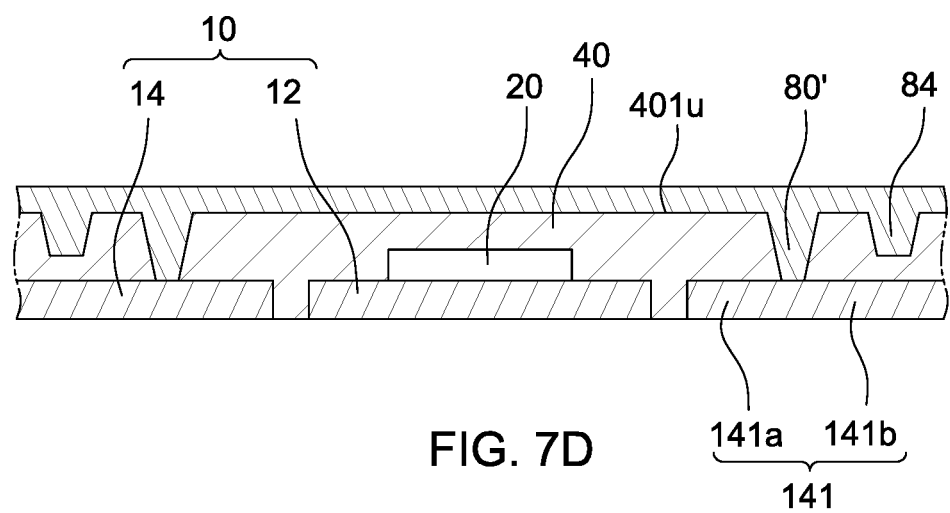
Figure 7E:
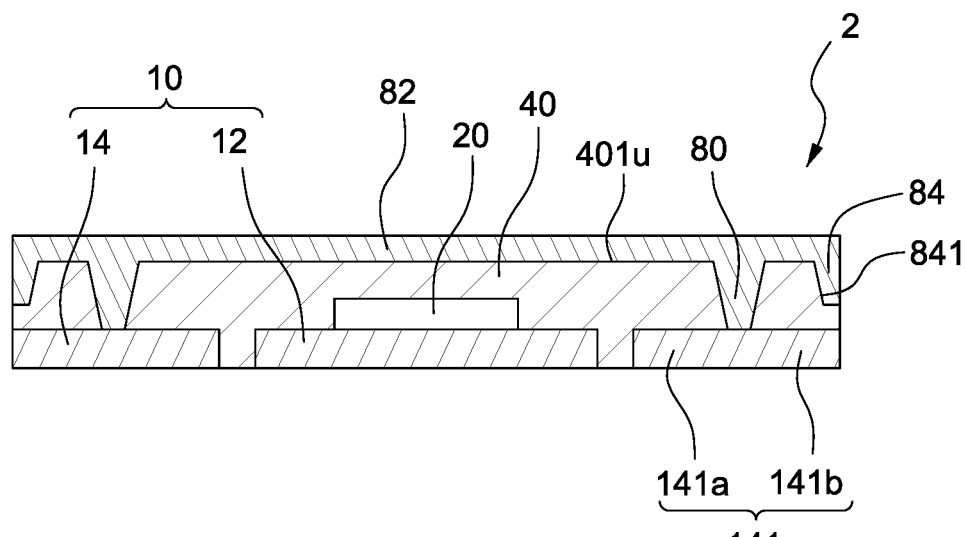

Referring to FIG. 7D, a conductive paste 80' is printed onto the upper surface 401u of the package body 40. The conductive paste 80' is also printed in to the at least one cavity 30 and the trench 32. The conductive paste 80' is electrically connected to the connection element 14. The conductive via 80, the conductive layer 82 and the conductive wall 84 are formed by the printing operation. The conductive via 80, the conductive layer 82 and the conductive wall 84 may be integrally formed as a monolithic structure. The conductive via 80 extends from the upper surface 401u of the package body 40 to the first portion 141a. The conductive wall 84 is separated from the connection element 14. Referring to FIG. 7E, after a singulation operation is performed, the semiconductor device package 2 shown in FIG. 2 is obtained.

Figure 8A:
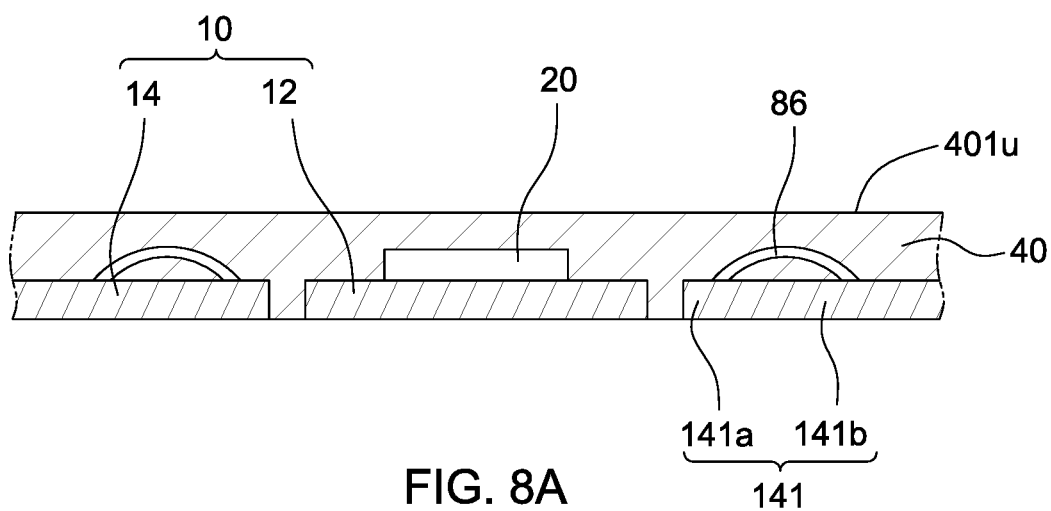
FIG. 8A, FIG. 8B, FIG. 8C, and FIG. 8D illustrate a method for manufacturing a semiconductor device package as shown in FIG. 4 in accordance with some embodiments.

FIG. 8A through FIG. 8D illustrate a method for manufacturing a semiconductor device package 4 as shown in FIG. 4 in accordance with some embodiments. Referring to FIG. 8A, a lead frame 10 is provided. The lead frame 10 includes a paddle 12, a connection element 14 and a plurality of leads 16 (e.g. a plurality of leads 16 as shown in FIG. 1B). In one or more embodiments, a material of the lead frame 10 may include, for example, copper, another metal, or other suitable conductive materials. The connection element 14 includes at least one tie bar 141 and at least one grounded lead 142 (e.g. a grounded lead 142 as shown in FIG. 1B). The tie bar 141 includes a first portion 141a adjacent to and connected to the paddle 12 (e.g. connected as shown in FIG. 1B) and a second portion 141b. The first portion 141a is disposed between the paddle 12 and the second portion 141b.

The electronic component 20 is disposed on a top surface of the paddle 12. In one or more embodiments, the electronic component 20 may include a semiconductor die. A wire element 86 (e.g. an arcuate wire element) is disposed on the connection element 14. The wire element 86 is bonded on the surface of the connection element 14. The package body 40 encapsulates the electronic component 20, the wire element 86 and the lead frame 10. The package body 40 has an upper surface 401u and a lower surface 401b opposite to the upper surface 401u. In one or more embodiments, a material of the package body 40 may include, for example, a molding compound or other suitable materials. In some embodiments, the wire element 86 may be implemented with a wire bond.

Figure 8B:
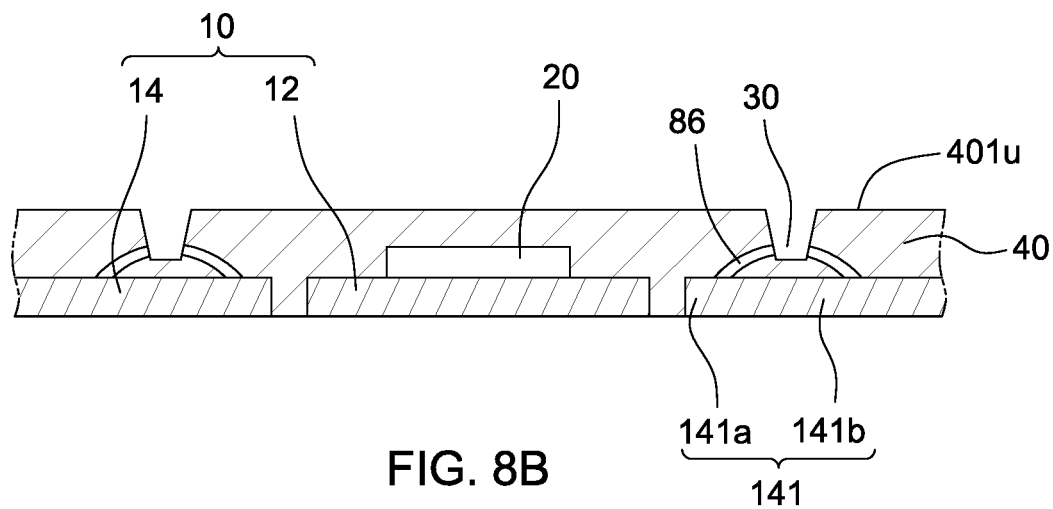

Referring to FIG. 8B, at least one cavity 30 is formed in the package body 40 by removing a portion of the package body 40 from the upper surface 401u. A portion of the wire element 86 is removed to expose the wire element 86 from a side wall of the cavity 30. The cavity 30 is a recess from the upper surface 401u and does not expose the connection element 14. The cavity 30 for accommodating the conductive via 80 is formed by a laser drilling operation.

Figure 8C:
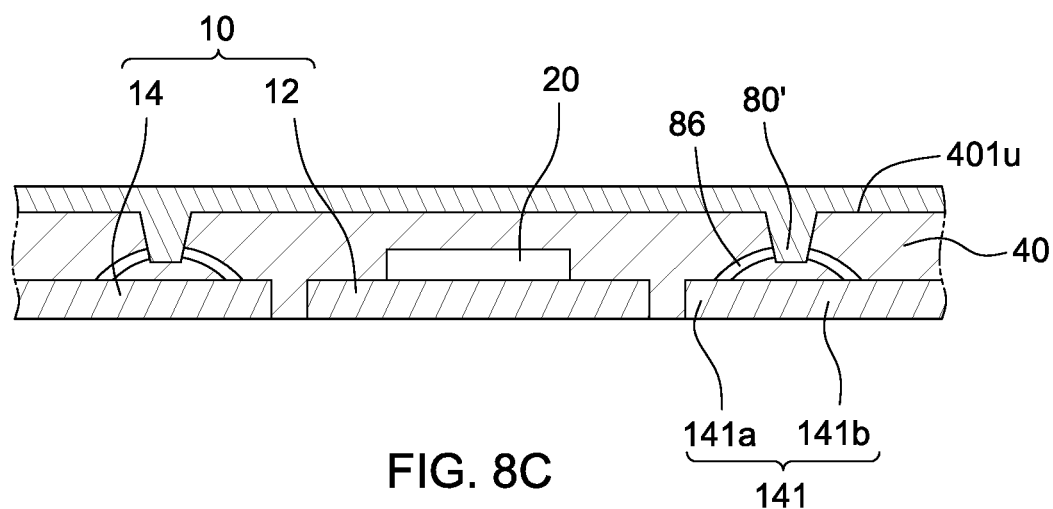
Figure 8D:
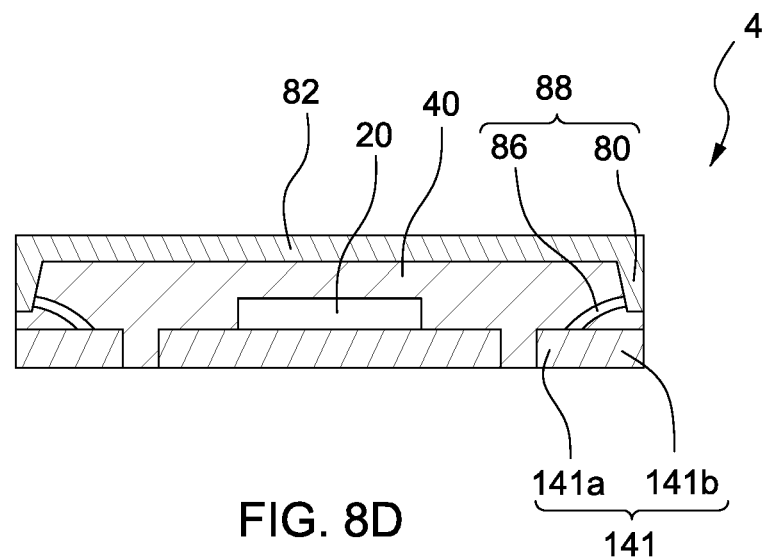

Referring to FIG. 8C, a conductive paste 80' is printed onto the upper surface 401u of the package body 40 and in to the at least one cavity 30. The conductive paste 80' is electrically connected to the wire element 86. The conductive via 80 and the conductive layer 82 are formed by the printing operation. The conductive via 80 extends from the upper surface 401u of the package body 40 and electrically connects to the first portion 141a through the wire element 86. Referring to FIG. 8D, after a singulation operation is performed, the semiconductor device package 4 shown in FIG. 4 is obtained.

Figure 9:
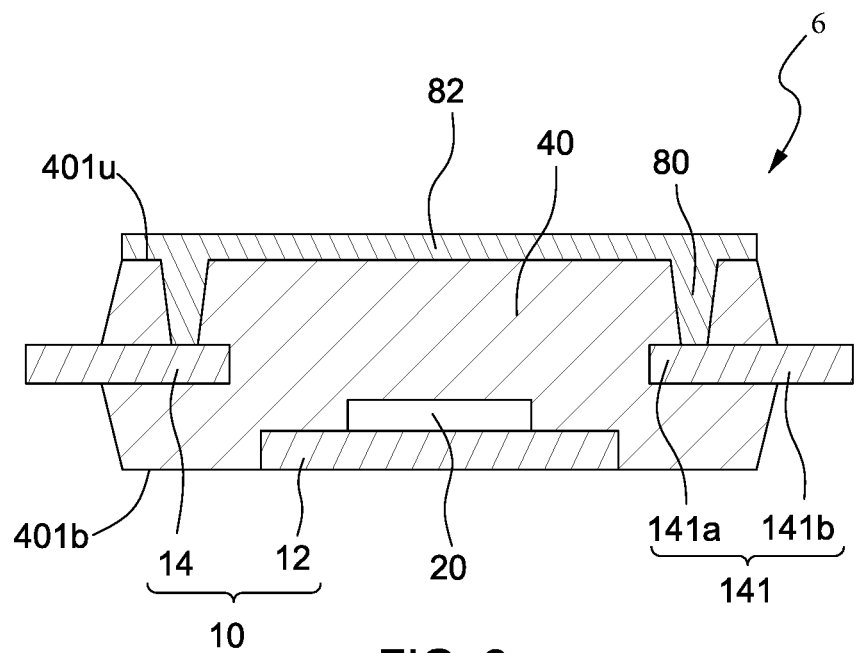
FIG. 9 is a cross-sectional view of a semiconductor device package in accordance with some embodiments of the present disclosure.

FIG. 9 is a cross-sectional view of a semiconductor device package 6 in accordance with some embodiments of the present disclosure. The semiconductor device package 6 shown in FIG. 9 is similar to the semiconductor device package 1 shown in FIG. 1A, and redundant description of same-numbered components may be omitted from the following description. The semiconductor device package 6 includes a lead frame 10, an electronic component 20, a package body 40, at least one conductive via 80 and a conductive layer 82.

The lead frame 10 includes a paddle 12, a connection element 14 and a plurality of leads 16 (e.g. a plurality of leads 16 as shown in FIG. 1B). The paddle 12 and the connection element 14 are not coplanar (e.g. are disposed at different elevations). The connection element 14 includes at least one tie bar 141 and at least one grounded lead 142 (e.g. a grounded lead 142 as shown in FIG. 1B). The connection element 14 may serve as a ground point. In one or more embodiments, the conductive via 80 for grounding is extending from the upper surface 401u of the package body 40 to the first portion 141a. The electronic component 20 is disposed on the paddle 12. In one or more embodiments, the electronic component 20 may include a semiconductor die. The electronic component 20 may be disposed below the connection element 14. In one or more embodiments, the semiconductor device package 6 may be a QFP structure.

Figure 10A:
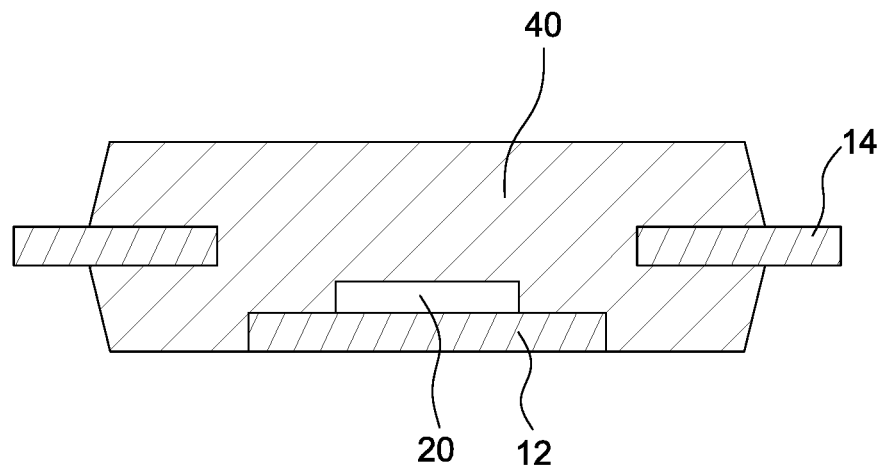
FIG. 10A, FIG. 10B, and FIG. 10C illustrate a method for manufacturing a semiconductor device package as shown in FIG. 9 in accordance with some embodiments.
Figure 10B:
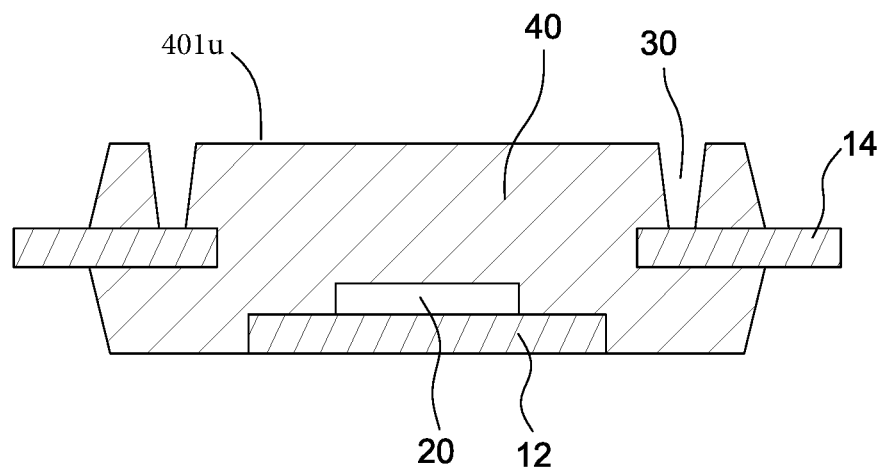
Figure 10C:
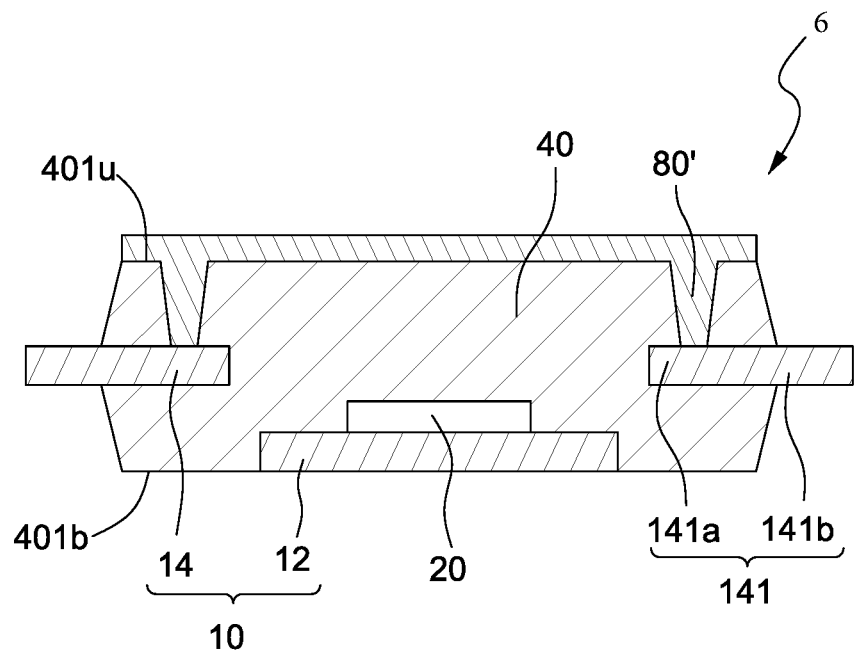

FIG. 10A through FIG. 10C illustrate a method for manufacturing a semiconductor device package 6 shown in FIG. 9 in accordance with some embodiments. Referring to FIG. 10A, a lead frame 10 is provided. The lead frame 10 includes a paddle 12, a connection element 14 and a plurality of leads 16 (e.g. a plurality of leads 16 as shown in FIG. 1B). In one or more embodiments, a material of the lead frame 10 may include, for example, copper, another metal, or other suitable conductive materials. The connection element 14 includes at least one tie bar 141 and at least one grounded lead 142 (e.g. a grounded lead 142 as shown in FIG. 1B). The tie bar 141 includes a first portion 141a adjacent to and connected to the paddle 12 (e.g. connected as shown in FIG. 1B) and a second portion 141b. The first portion 141a is disposed between the paddle 12 and the second portion 141b.

The electronic component 20 is disposed on a top surface of the paddle 12. In one or more embodiments, the electronic component 20 may include a semiconductor die. The package body 40 encapsulates the electronic component 20 and the lead frame 10. A portion of the connection element 14 is exposed for external electrical connection. In one or more embodiments, the material of the package body 40 may include, for example, a molding compound or other suitable materials.

Referring to FIG. 10B, at least one cavity 30 is formed in the package body 40 by removing a portion of the package body 40 from the upper surface 401u. The cavity 30 is a recess from an upper surface 401u of the package body 40 and exposes a portion of a surface of the connection element 14. The cavity 30 can accommodate the conductive via 80 and can be formed by a laser drilling operation.

Referring to FIG. 10C, a conductive paste 80' is printed onto the upper surface 401u of the package body 40 and in to the at least one cavity 30. The conductive paste 80' forms a conductive via 80 that electrically connects to the connection element 14. The conductive via 80 extends from the upper surface 401u of the package body 40 to the first portion 141a of the tie bar 141. The conductive via 80 and the conductive layer 82 are formed by the printing operation. Thus, the semiconductor device package 6 shown in FIG. 9 is obtained.

Figure 11:
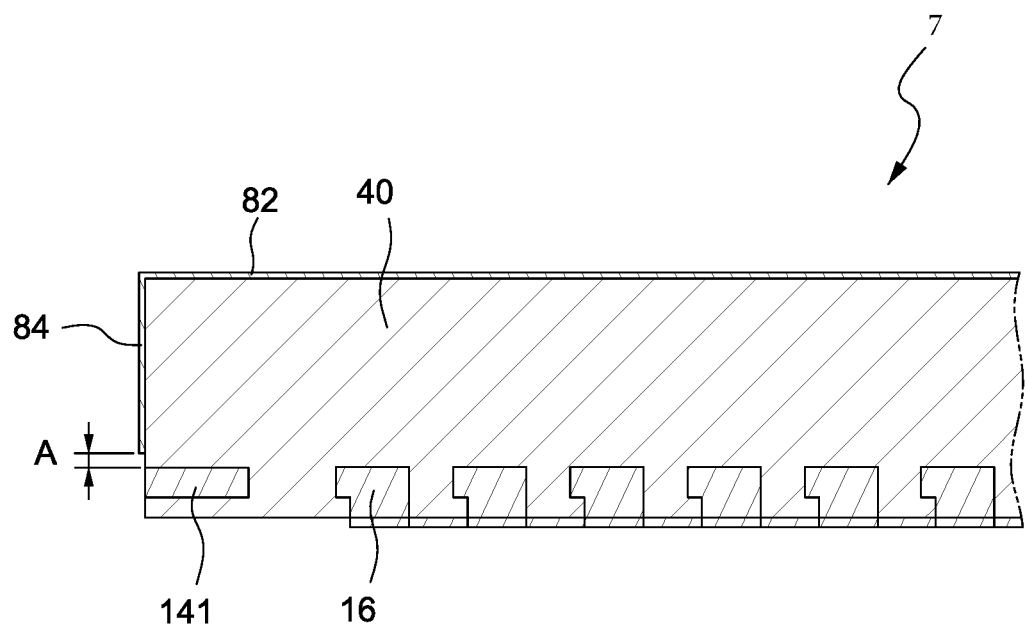
FIG. 11 illustrates a schematic shielding structure of a semiconductor device package in accordance with some embodiments of the present disclosure.

FIG. 11 is a schematic illustration of a shielding structure of a semiconductor device package 7 in accordance with some embodiments of the present disclosure. A plurality of leads 16 and a tie bar 141 are encapsulated by a package body 40. A conductive layer 82 is disposed on a top surface of the package body 40. A conductive wall 84 is electrically connected to the conductive layer 82. The conductive wall 84 also surrounds a side wall of the package body 40 and covers a portion of the side wall of the package body 40. The distance between the conductive wall 84 and a top surface of the tie bar 141 is referred to as "A." The conductive layer 82 and conductive wall 84 may serve as a shielding element.

Figure 12:
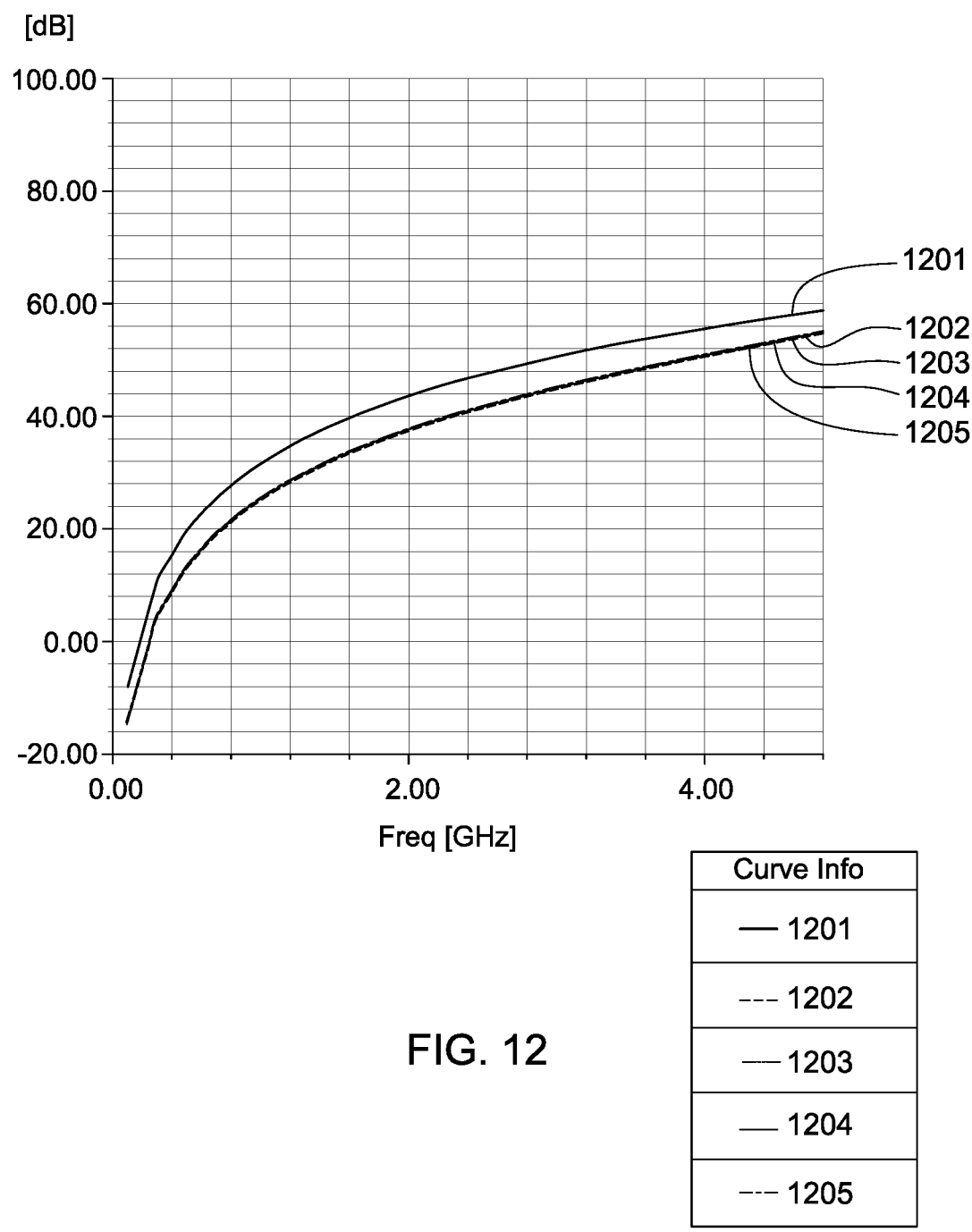
FIG. 12 shows five plots of shielding efficiency simulated for a shielding structure of a semiconductor device package as shown in FIG. 11.

FIG. 12 provides five plots of simulated shielding efficiencies for different shielding structures of the semiconductor device package 7 shown in FIG. 11, showing decibels as a function of frequency in gigahertz (GHz). Electromagnetic field strength will be reduced as the shielding efficiency is increased. The plot 1201 illustrates a lowest shielding efficiency for the semiconductor device package 7, corresponding to an implementation that omits a shielding element (e.g. omits the conductive layer 82 and the conductive wall 84). As can also be seen, the electromagnetic field strength of plot 1201 is higher than the electromagnetic field strengths of plots 1202-1205.

The plot 1202 corresponds to an implementation of the semiconductor device package 7 including the conductive layer 82 at a top side, and omitting the conductive wall 84. The plot 1203 corresponds to an implementation of the semiconductor device package 7 including the conductive layer 82 at the top side and the conductive wall 84 having a distance A from a top surface of the tie bar 141 of 50 micrometers (μm). The plot 1204 corresponds to an implementation of the semiconductor device package 7 including the conductive layer 82 at the top side and the conductive wall 84 having a distance A from the top surface of the tie bar 141 of 100 μm. The plot 1205 corresponds to an implementation of the semiconductor device package 7 including the conductive layer 82 at the top side and the conductive wall 84 having a distance A from the top surface of the tie bar 141 of 200 μm. As can also be seen, the electromagnetic field strengths of plots 1202-1205 are close to each other. The shielding efficiencies of the plots 1202-1205 are close to each other. The shielding efficiency of the shielding provided on the top side and omitted from a lateral side will be substantially the same as shielding efficiency of some comparative implementations including shielding on the top side and on four lateral sides, with a gap between the lateral shielding and the top surface of the tie bar 141.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

As used herein, the singular terms "a," "an," and "the" may include plural referents unless the context clearly dictates otherwise.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μm, or no greater than 15 μm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
a lead frame comprising a connection element and a plurality of leads;
a package body encapsulating the lead frame, wherein the package body includes a lower surface and an upper surface opposite to the lower surface, the package body includes a cavity exposing at least one of the leads;
at least one conductive via disposed in the cavity of the package body, electrically connected to the connection element, and exposed from the upper surface of the package body; and
a conductive layer disposed on the upper surface of the package body and the conductive via.

2. The semiconductor device package of claim 1, wherein the at least one conductive via extends from the upper surface to the lower surface and is in contact with the connection element.

3. The semiconductor device package of claim 1, wherein the lead frame further comprises a paddle, and wherein the semiconductor device package further comprises an electronic component disposed on the paddle.

4. The semiconductor device package of claim 3, further comprising a conductive wall extending from the upper surface into the package body, the conductive wall surrounding the electronic component and electrically connected to the at least one conductive via through the conductive layer.

5. The semiconductor device package of claim 4, wherein the package body is disposed between and separates the conductive wall and the leads.

6. The semiconductor device package of claim 4, wherein the at least one conductive via is disposed between the conductive wall and the electronic component.

7. The semiconductor device package of claim 1, wherein at least one of the leads defines a step structure adjacent to a lateral surface of the package body.

8. The semiconductor device package of claim 7, wherein the step structure is defined by a lower surface of the at least one of the leads.

9. The semiconductor device package of claim 1, further comprising at least one wire element connected to the connection element and encapsulated by the package body, wherein the at least one conductive via is electrically connected to the connection element through the at least one wire element.

10. The semiconductor device package of claim 9, wherein the package body is disposed between and separates the at least one conductive via and the connection element.

11. The semiconductor device package of claim 1, wherein the connection element comprises a tie bar.

12. The semiconductor device package of claim 1, wherein the connection element comprises a grounded lead.

13. A semiconductor device package, comprising:
a lead frame comprising a tie bar and a plurality of leads;
a package body encapsulating the lead frame, the package body having an upper surface and a lower surface opposite to the upper surface, wherein the lower surface exposes the tie bar;
a grounding element extending from the upper surface of the package body to a first portion of the tie bar, wherein the grounding element comprises a conductive via and a wire element, and wherein the conductive via electrically connects to the tie bar by the wire element; and
a conductive layer disposed on the upper surface of the package body and electrically connected to the grounding element.

14. The semiconductor device package of claim 13, wherein the lead frame further comprises a paddle, and wherein the semiconductor device package further comprises an electronic component disposed on the paddle.

15. The semiconductor device package of claim 14, further comprising a conductive wall extending from the upper surface into the package body, wherein the conductive wall surrounds the electronic component and electrically connects to the grounding element through the conductive layer.

16. The semiconductor device package of claim 13, wherein the grounding element substantially covers a width of a portion of the tie bar.

17. The semiconductor device package of claim 13, wherein at least one of the leads defines a step structure adjacent to a lateral surface of the package body.

18. The semiconductor device package of claim 17, wherein the step structure is defined by a lower surface of the at least one of the leads.

19. The semiconductor device package of claim 13, wherein a portion of the conductive via is exposed from the upper surface of the package body.

20. The semiconductor device package of claim 19, wherein the package body separates the conductive via from the tie bar.

* * * * *